(12) United States Patent
Li et al.

(10) Patent No.: US 6,768,160 B1
(45) Date of Patent: Jul. 27, 2004

(54) NON-VOLATILE MEMORY CELL AND METHOD OF PROGRAMMING FOR IMPROVED DATA RETENTION

(75) Inventors: Yu Li, Sunnyvale, CA (US); Zhizheng Liu, Sunnyvale, CA (US); Mark W. Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/352,658

(22) Filed: Jan. 28, 2003

(51) Int. Cl.$^7$ .............................................. H01L 29/788
(52) U.S. Cl. ........................ 257/315; 257/315; 257/285
(58) Field of Search ................................. 257/315, 321, 257/365, 314, 326, 316; 365/185.29, 185.33

(56) References Cited

U.S. PATENT DOCUMENTS

| | | |
|---|---|---|
| 5,553,020 A | 9/1996 | Keeney et al. |
| 5,644,532 A | 7/1997 | Chang |
| 5,776,787 A | 7/1998 | Keshtbod |
| 6,172,907 B1 | 1/2001 | Jenne |
| 6,259,645 B1 | 7/2001 | Chen et al. |
| 6,349,062 B1 | 2/2002 | Thurgate |
| 6,356,482 B1 | 3/2002 | Derhacobian et al. |
| 6,381,179 B1 | 4/2002 | Derhacobian et al. |
| 6,388,293 B1 * | 5/2002 | Ogura et al. ................. 257/365 |
| 2003/0235083 A1 * | 12/2003 | Swift et al. ............. 365/185.29 |

* cited by examiner

Primary Examiner—David Nelms
Assistant Examiner—Thinh T Nguyen
(74) Attorney, Agent, or Firm—Renner, Otto, Boisselle & Sklar, LLP

(57) ABSTRACT

An array of non-volatile memory cells is provided for storing a data pattern and reproducing the data pattern. The array comprises a semiconductor substrate moderately doped with a first type of impurity to enhance conductivity. A plurality of bit lines within the substrate define a plurality of vertical channel regions spaced there between. Each bit line comprises the substrate doped with a second type of impurity to enhance conductivity. Each channel comprises a moderately doped channel region portion adjacent to a first one of the bit lines and a slightly more heavily doped channel region portion adjacent to a second one of the bit lines. A plurality of parallel spaced apart semiconductor word lines are positioned over the substrate and separated from the substrate by an insulator film, a charge storage region, and a second insulator film. An array control circuit is coupled to each bit line and each word line to provide a drain bit line programming potential the second one of the bit line diffusions to accelerating electrons from the first one of the bit line diffusions towards the second one of the bit line diffusions and to provide a word line programming potential to a selected one of the word lines to divert the accelerated electrons from the channel region beneath the selected word line across the insulator film into the charge storage region.

20 Claims, 5 Drawing Sheets

NON-VOLATILE MEMORY CELL AND METHOD OF PROGRAMMING FOR IMPROVED DATA RETENTION

TECHNICAL FIELD

The present invention relates generally to flash memory cell devices and more specifically, to improvements in charge distribution of charge trapping memory cell devices.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain up to 6.0eV of kinetic energy which is more than sufficient to cross the 3.2eV $Si-SiO_2$ energy barrier between the channel region and the tunnel oxide. While the electrons are accelerated towards the drain, those electrons which collide with the crystalline lattice are re-directed towards the $SiO_2$ interface under the influence of the control gate electric field and will cross the tunnel oxide and reach the floating gate—where such electrons remain as a stored charge.

Once programmed, the negative charge on the floating gate disburses across the semi conductive gate and has the effect of increasing the threshold voltage of the FET characterized by the source region, drain region, channel region, and control gate.

During a "read" of the memory cell, the programmed, or non-programmed, state of the memory cell can be detected by detecting the magnitude of the current flowing between the source and drain at a predetermined control gate voltage.

More recently dielectric memory cell structures have been developed. Each dielectric memory cell is characterized by a vertical stack of an insulating tunnel layer, a charge trapping dielectric layer, an insulating top oxide layer, and a polysilicon control gate positioned on top of a crystalline silicon substrate. This particular structure of a silicon channel region, tunnel oxide, nitride, top oxide, and polysilicon control gate is often referred to as a SONOS device.

Similar to the floating gate device, the SONOS memory cell is programmed by inducing hot electron injection from the channel region to the nitride layer to create a non volatile negative charge within charge traps existing in the nitride layer. Again, hot electron injection can be achieved by applying a drain-to-source bias along with a high positive voltage on the control gate. The high voltage on the control gate inverts the channel region while the drain-to-source bias accelerates electrons towards the drain region. The accelerated electrons gain up to 6.0 eV of kinetic energy which is more than sufficient to cross the 3.2 eV $SiO_2$ energy barrier between the channel region and the tunnel oxide. While the electrons are accelerated towards the drain region, those electrons which collide with the crystalline lattice are re-directed towards the $SiO_2$ under the influence of the control gate electric field and have sufficient energy to cross the barrier.

Because the nitride layer stores the injected electrons within traps and is otherwise a dielectric, the trapped electrons remain localized within a charge storage region that is close to the drain region. More specifically, the accelerated electrons will reach sufficient energy to cross the energy barrier at a specific "hot point" distance between the source region and the drain region. In operation, the accelerated electrons reach sufficient energy within a very small deviation of the "hot point" and therefore the stored charge tends to be concentrated in the charge trapping layer around the "hot point".

A problem associated with an extremely concentrated charge is that each electron is under a strong repulsive force from the other electrons. The high electric field created by these electrons subjects the surrounding dielectric material to field stress. Both factors can cause charge loss and misreading of the cell.

What is needed is a non-volatile dielectric memory cell structure and programming method that provides for increasing the size of the charge storage region and subsequently decreasing the charge concentration.

SUMMARY OF THE INVENTION

A first aspect of the present invention is to provide an array of non-volatile memory cells for storing a data pattern and reproducing the data pattern. The array comprises a plurality of memory cells arranged in a matrix with its rows defined by a plurality of parallel spaced apart word lines and its columns defined by a plurality of bit line diffusions within the substrate.

The array comprises a moderately doped p-type substrate. A plurality of spaced apart heavily doped n-type bit lines are formed through ion implantation into the p-type substrate to define channel regions there between. An insulating layer consisting of a tunnel insulator layer, a charge trapping (or storage) layer, and a top insulator layer, is formed on top of the substrate. A plurality of spaced apart polysilicon word lines are positioned on top of the insulator layer. Each of the word lines is perpendicular to the bit lines and a memory cell is formed at the intersection of each word line and each channel region.

Each channel comprises a moderately doped portion and a slightly more heavily doped portion. The moderately doped portion of the channel is adjacent to a first, or source, one of the bit lines and consists of moderately doped n-type material. The slightly more heavily doped portion of the channel is adjacent to a second, or drain, one of the bit lines and consist of a heavily doped n-type of material. The moderately doped portion and the slightly more heavily doped portion together comprise the entire channel.

The slightly more heavily doped portion facilitates kinetic energy gain of the electrons thereby enabling a portion of the electrons to gain sufficient energy to cross the 3.2 eV $SiO_2$ barrier at a point within the channel that is closer to the source region than the point at which such electrons would have gained sufficient energy without the heavier doping concentration. As such, the linear distribution across the channel length (e.g. distance between the source bit line and the drain bit line) at which electrons gain sufficient energy to cross the $SiO_2$ barrier is increased, but still confined to the slightly more heavily doped portion of the channel region.

An array control circuit is coupled to each bit line and each word line. The array control circuit provides a drain to source programming potential bias to draw electrons from the source bit line into the channel region and accelerate the electrons towards the drain bit line during programming of a memory cell.

The array control circuit also provides a word line programming potential to a selected one of the word lines to provide an electric filed thereby diverting the accelerated electrons from the channel region beneath the selected word line across the tunnel insulator film into the charge storage region. The electrons are diverted over a substantial portion of the channel length within the slightly more heavily doped channel region to decrease the trapped charge density and spread the trapped charge over a substantial portion of the channel length.

More specifically, the drain bit programming potential and the word line programming potential provide for approximately 0.01 percent of the electrons drawn from the source bit line diffusion to gain adequate kinetic energy to cross the energy barrier between the tunnel insulator film over a length greater than 5 percent of the channel length.

In another embodiment, the drain bit programming potential and the word line programming potential provide for approximately 0.01 percent of the electrons drawn from the source bit line diffusion to gain adequate kinetic energy to cross the energy barrier between the tunnel insulator film over a length greater than two percent of the channel length.

In yet another embodiment, the drain bit programming potential and the word line programming potential provide for approximately 0.01 percent of the electrons drawn from the source bit line diffusion to gain adequate kinetic energy to cross the energy barrier between the tunnel insulator film over a length greater than 10 percent of the channel length.

The drain bit line programming potential and the word line programming potential are a positive potential with respect to a potential applied to the source bit line. And, the word line programming potential is greater than the drain bit line programming potential. The drain bit line programming potential may be between 4 volts and 6 volts.

The thickness of the charge storage region will optimally be close to 30 angstroms. A thickness of less than 30 angstroms tends to result in thickness non-uniformity and hydrogen diffusion. As the thickness is increased, the charge sheet density tends to increase. The thickness of the charge storage region may be between 30 angstroms and 50 angstroms. A broader range would include a thickness of the charge storage region between 25 angstroms and 75 angstroms. A broader, and less ideal range, would include a thickness of the charge storage region between 20 angstroms and 100 angstroms.

The length of the moderately doped channel region may be 90 percent of the length of the overall channel region while the length of the slightly more heavily doped channel region may be 10 percent of the channel region.

For a better understanding of the present invention, together with other and further aspects thereof, reference is made to the following description, taken in conjunction with the accompanying drawings. The scope of the invention is set forth in the appended clams.

DESCRIPTION OF THE PREFERRED EMBODIMENTS

Figure 1:
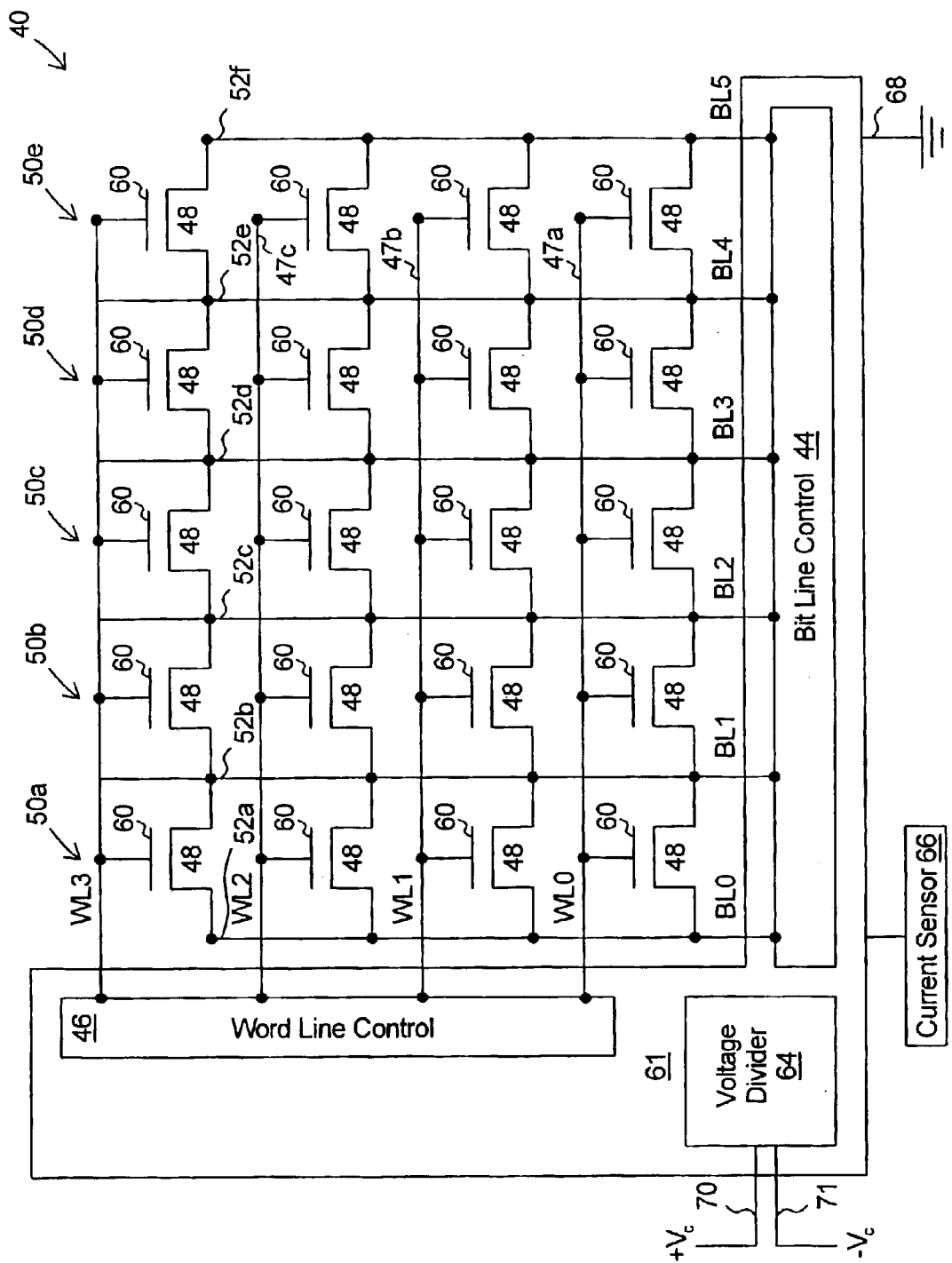
FIG. 1 is a schematic, block diagram view of a dielectric memory cell array in accordance with one embodiment of the present invention.

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2:
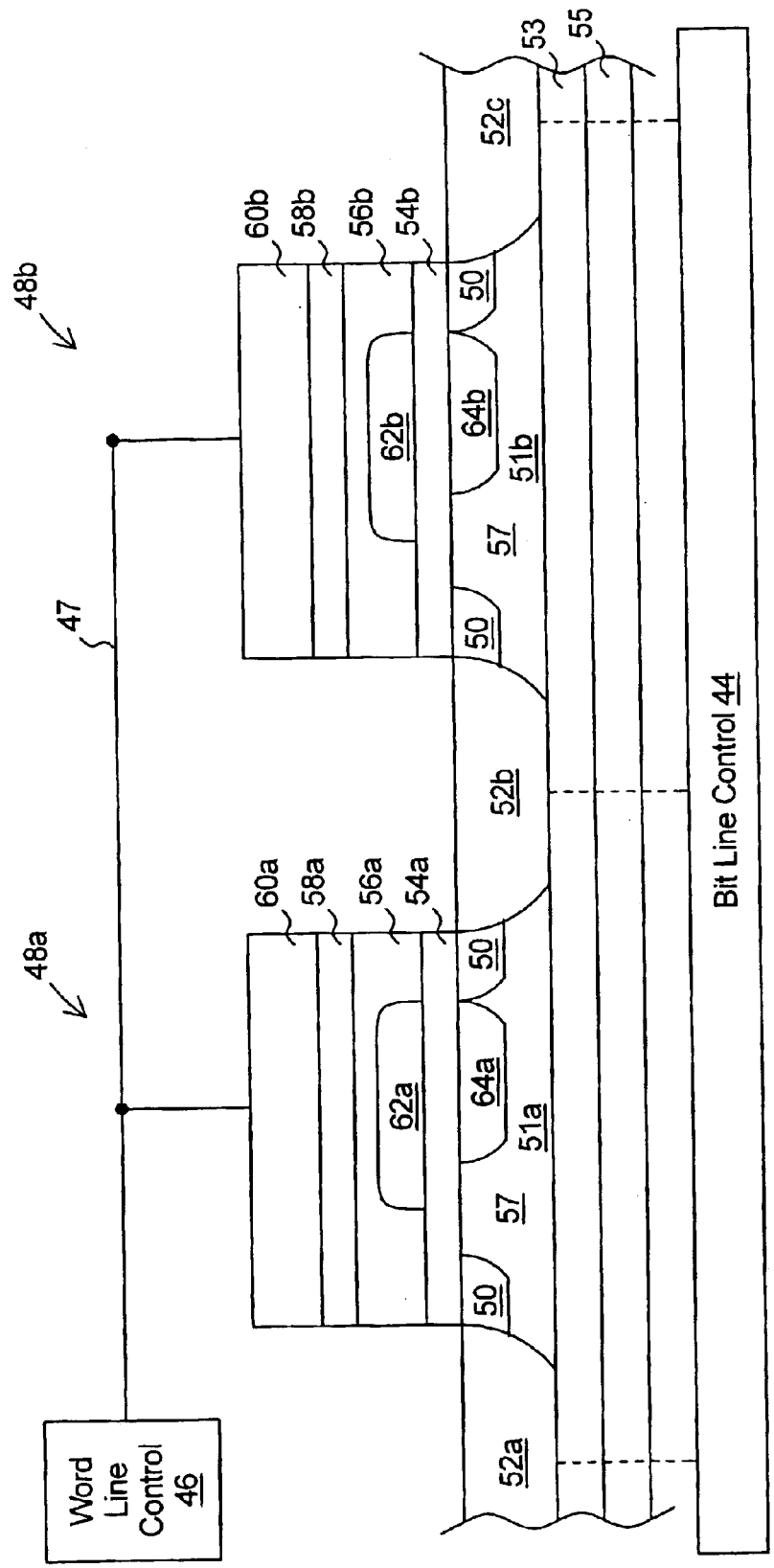
FIG. 2 is a schematic, cross sectional view of a portion of the dielectric memory cell array of FIG. 1.

FIG. 1 shows an exemplary embodiment of a dual bit dielectric memory cell array 40 in block diagram form. The array 40 comprises a plurality of dual bit dielectric memory cells 48, an array control circuit 61, and a current sense circuit 66 fabricated on a crystalline semiconductor substrate. The array of dual bit dielectric memory cells 48 is arranged in a matrix format with horizontal rows of polysilicon word lines 47a–47d and vertical columns defined by alternating bit line diffusions 52a–52f and channel regions 50a–50e within the substrate 42 (FIG. 2). Each cell 48 within a column shares the same two bit lines 52 that are adjacent to, and form a junction with, each cell's channel region 50. Each cell 48 within a row shares the same word line 47a–47d with other cells 48 in the row.

FIG. 2 represents a cross section diagram of a portion of a single row of non-volatile memory cells (e.g. cells 48a and 48b) which share a common word line 47. Turning to FIG. 2 in conjunction with the FIG. 1, it should be appreciated that the polysilicon word line 47 is structured to form a control gate 60 over each memory cell 48a and 48a b within the row. Each bit line diffusion 52a, 52b, and 52c is of opposite semiconductor conductivity as each channel region 51a and 51b such that each bit line diffusion 52a, 52b, and 52c forms a semiconductor junction with the two channel regions 51 between which the bit line 52 is positioned. Each bit line 52 forms a source region and/or a drain region for each cell in the two columns that are defined by the two channel regions 51 that are adjacent to the bit line diffusion 52. For example, bit line 52b forms a junction with each of channel regions 51a and 51b and functions as a drain bit line for cell 48a and functions as a source bit line for cell 48b.

In the exemplary embodiment, each memory cell 48 is an n-mos device. As such, each channel region 51 is a p-type semiconductor such as crystalline silicon implanted with a hole donor impurity such boron and each bit line diffusion 52 is an n-type semiconductor such as crystalline silicon implanted with an electron donor impurity such as arsenic.

Each channel region comprises a moderately doped portion 57 comprising a portion of the channel region 51 and a slightly more heavily doped portion 64 comprising the remainder of the channel region 51. The moderately doped portion 57 is adjacent to a first one of the bit lines 52 which comprises a source bit line for the memory cell 48. The slightly more heavily doped portion 64 is adjacent to a second one of the bit lines 52 which comprises a drain bit line for the memory cell 48.

The slightly more heavily doped portion facilitates kinetic energy gain of the electrons thereby enabling a portion of the electrons to gain sufficient energy to cross the 3.2 eV $SiO_2$ barrier at a point within the channel that is closer to the source region than the point at which such electrons would have gained sufficient energy without the heavier doping concentration. As such, the linear distribution across the channel length at which electrons gain sufficient energy to cross the $SiO_2$ barrier is increased, but still confined to the slightly more heavily doped portion of the channel region.

Above the channel region 51 if of each memory cell 48 is a first insulating barrier, or tunnel layer, 54 which may comprise silicon dioxide. The thickness of the tunnel layer 54 may be within a range of about 50 to about 150 angstroms. An embodiment with a more narrow bracket includes a tunnel layer 54 thickness within a range of about 60 to about 90 angstroms and even narrower yet, a tunnel layer 54 with a thickness of about 70 to about 80 angstroms.

The moderately doped portion 57 of the channel region 51 vertically extends from the first insulating barrier 54 to an insulating layer 53 beneath the channel region 51 and laterally extends between its junction with the bit line 52 functioning as the source region and its interface with the slightly more heavily doped portion 64. The slightly more heavily doped portion 64 vertically extends from the first insulating barrier 54 to a depth within the channel region 51 of about 100 angstroms and lateral extends between its interface with the moderately doped portion 57 and its junction with the bit line 52 functioning as the drain region. Within the channel region 51 below the slightly more heavily doped portion 57 is moderately doped material.

Above the tunnel layer is a charge trapping layer 56 that includes a charge trapping region 62 for storing a neutral charge representing an un-programmed state or a low sheet density negative charge representing a programmed state. In the exemplary embodiment, the sheet density may be on the order of $3 \times 10^6$ electrons per square centimeter. The charge trapping layer 56 may comprise a nitride compound with suitable charge trapping properties and may have a thickness on the order of 20 to 100 angstroms. A narrower range may include a thickness on the order of 30 to 50 angstroms such that non-uniformities in the charge trapping layer 56 thickness do not detrimentally effect operation and the thickness is adequate to block hydrogen diffusion. In the exemplary embodiment, the nitride compound may be selected from the group consisting of $Si_2N_4$, $Si_3N_4$ and $SiO_xN_4$.

Above the charge trapping layer 56 is a top dielectric layer 58. The top dielectric layer 58 may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$ and other materials with similarly high dielectric constants. If the top dielectric layer 58 is silicon dioxide, the layer 58 may have a thickness on the order of 60 to 100 angstroms. Alternatively, if the top dielectric layer 58 is a high K material, its electrical thickness may be on the order of 60 to 100 angstroms while its physical thickness may be within a range of about 70 to 130 angstroms. An embodiment with a more narrow bracket includes a top dielectric layer 58 with a physical thickness within a range of about 80 to about 120 angstroms and even narrower yet, a top dielectric layer 58 with a physical thickness of about 90 to about 100 angstroms.

Above the top dielectric layer 58 is the word-line 47 that forms a gate 60 over each memory cell 48 within the row 43. In the exemplary embodiment, the gate 60 may comprise polysilicon with a thickness on the order of 4,000 angstroms. The word-line 47 is coupled to the word line control circuit 46 (FIG. 1).

Returning again to FIG. 1, the array control circuit 61 comprises a word line control circuit 46, a bit line control circuit 44, a voltage divider circuit 64, a coupling to a positive operating power source (Vc) 70, a coupling to a negative operating power source (-Vc) 71, and a coupling to a ground 68.

In operation, the array control circuit operates to selectively couple each word line 47a–47d and each bit line 52a–52f to a voltage provided by the voltage divider 64 or to ground (or to isolate the word line 47a–47d or bit line 52a–52f from all voltage sources and ground such that is potential is effected only by electrical interaction with other structure of the array 40). The coupling is in such a manner that each charge trapping region 62 within the array 40 can be erased, selectively programmed with a low sheet density charge, and selectively read. The array control circuit also operates to couple a selected bit line to the current sensor 66 such that a current on the selected bit line may be measured to indicate the programmed state of a selected charge trapping region 62 of a cell within a column of cells in which such selected bit line is either a source or a drain.

The current sensor 66 may utilize known circuits for sensing current on the selected bit line that is coupled to the current sensor 66 by the bit line control circuit 44. The current sensed represents the programmed state of a selected one of a charge trapping regions 62 when applicable potentials are coupled to applicable word lines and bit lines by the array control circuit 61 for reading the selected charge trapping region as described in more detail herein.

Array Control Circuit

Figure 4:
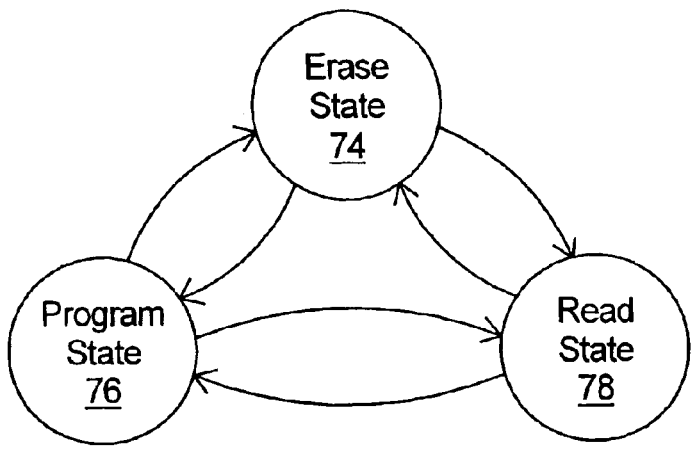
FIG. 4 is a state machine diagram representing exemplary operation of an array control circuit.

Turning briefly to FIG. 4 in conjunction with FIG. 1 and FIG. 2, the array control circuit 61 operates in three states, a program state 76 where in charge is selectively stored into the charge trapping region 62 of a selected one of the memory cells 48, a read state 78 wherein a stored charge is detected from the charge trapping region 62 of a selected one of the memory cells 48 to reproduce data originally stored in such charge trapping region 62, and an erase state 78 wherein charge stored in each charge trapping region 62 of one or more memory cells 48 is removed prior to reprogramming in the program state 76.

Programming State

When in the program state 76, the charge trapping region 62 is programmed by injecting electrons into the charge trapping region 62 of a selected memory cell 48 using a hot electron injection technique. More specifically, the array control circuit 61 couples bit lines 52a–52f and the word lines 47a–47d to various potentials (e.g provided by the voltage divider 64 and ground 68) to apply a high drain-to-source bias on the selected memory cell 48 while applying a low voltage to the control gate 60 of the selected memory cell 48 to draw and accelerate electrons from the bit line 49 that forms a source region of the memory cell 48 into the moderately doped portion of the channel region 51 towards the bit line 49 that forms a drain region of the memory cell 48. The field caused by the voltage on control gate 60 redirects the electrons towards the charge trapping region 62. Those electrons that cross the interface into the charge trapping region 62 remain trapped within the charge trapping layer 56 for later reading. The electric field caused by the trapped electrons effects accumulation in the channel region 51 beneath the trapped electrons and is represented by the equation:

$$\text{Electric Field} = \frac{\text{Sheet Density}}{2*K} = \frac{\text{Total Trapped Charge}}{2*W*L*K}$$

Wherein W is the channel width, L is the length of the charge distribution within the charge trapping layer, and K is the dielectric constant of the charge trapping material.

The present invention provides for reduction of the sheet density (e.g. charge concentration of injected electrons around a very tight hot point) while maintaining the overall electric field. Because the width of the channel is fixed for a particular memory array design and the dielectric constant of the charge trapping material is not readily alterable, this invention provides for increasing the length of the charge distribution within the charge trapping layer. As such, the overall electric field is maintained, but the sheet density is reduced lessening the field stress on the surrounding dielectric material.

For example, referring to cell 48b, the reduction in charge sheet density may be accomplished by the bit line control circuit 44 coupling the bit line 52b, which represents the source region of cell 48b, to ground 68 and the bit line control circuit 44 coupling the bit line 52c, which represents the drain region of cell 48b, to a programming voltage from the voltage divider 64 of approximately 10 volts.

Simultaneously, the word line control circuit 46 couples the selected word line 47, representing the control gate 60 of the memory cell 48b, to a selected word line programming voltage from the voltage divider 64 of approximately 5 volts and may couple non-selected word lines (e.g. the word lines other than the selected word line) to a small negative bias voltage to prevent punch-through current leakage through non-selected memory cells that share the same column as the selected memory cell 48b. The high drain-to-source bias draws and accelerates electrons from the source region 52b into the moderately doped portion of the channel region 51b towards the drain region 52c.

The 4.5eV to 5eV kinetic energy gain of the electrons is more than sufficient to surmount the 3.1 eV to 3.5eV energy barrier at channel region 51b/tunnel layer 54b interface and, while the electrons are accelerated towards drain region 52c, the field caused by the high voltage on control gate 60b redirects the electrons towards the drain charge trapping region 64b. Those electrons that cross the interface into the charge trapping region 62b remain trapped within the charge trapping layer 56b for later reading.

Erase State

When in the erase state 74, the array control circuit may couple applicable bit lines 52a–52f and word lines 72 to applicable potentials such that the charge trapping region 62 of multiple cells are erased using either a hot hole injection technique or by tunneling the electrons from the charge trapping layer 56 to the gate 60 or to the substrate 42. Both techniques are known in the art.

Read State

When in the read state 78, the presence of trapped electrons (e.g a negative charge representing a programmed state) in a selected charge trapping region 62 is detected. It is recognized that the presence of trapped electrons within a charge trapping region 62 effect accumulation within the channel region 50 below such charge trapping region 62. As such, the presence of trapped electrons in the charge trapping region 62 effect the threshold voltage of a field effect transistor (FET) characterized by the control gate 60, a bit line diffusion 52 that functions as a source region, and a bit line diffusion 52 that functions as a drain region. Therefore, the memory cell 48 may be "read", or more specifically, the presence of electrons stored within the charge trapping region 62 may be detected by operation of the FET.

In particular, the presence of electrons stored within the charge trapping region 62 may be detected by applying a positive voltage to the control gate 60 and a lesser positive voltage to the bit line 52 that functions as the drain region while the bit line 52 that functions as the source region is grounded. The current flow through the channel region 51 is then measured at the bit line 52 that functions as the source region or the bit line 52 that functions as the drain region. Assuming proper voltages and thresholds for measurement (and assuming no current leakage from adjacent memory cells 48 within the same row as the selected cell 48 and assuming no current leakage from memory cells 48 within the same column as the selected cell 48) if there are electrons trapped within the charge trapping region 62, no measurable current will be measured. Otherwise, if the source charge trapping region 62 is charge neutral (e.g., no trapped electrons) then there will be a measurable current flow out of the bit line 52 functioning as the source region, through the channel region 51 and into the bit line 52 functioning as the drain region.

Fabrication Process

Figure 3A:
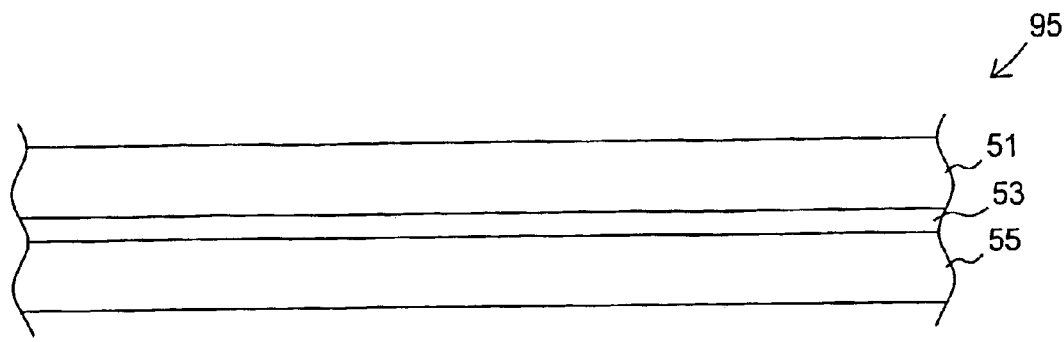
FIGS. 3a, 3b, 3c, 3d, and 3e are schematic, cross sectional views of a portion of the dielectric cell array of FIG. 1 at various steps of fabrication.
Figure 5:
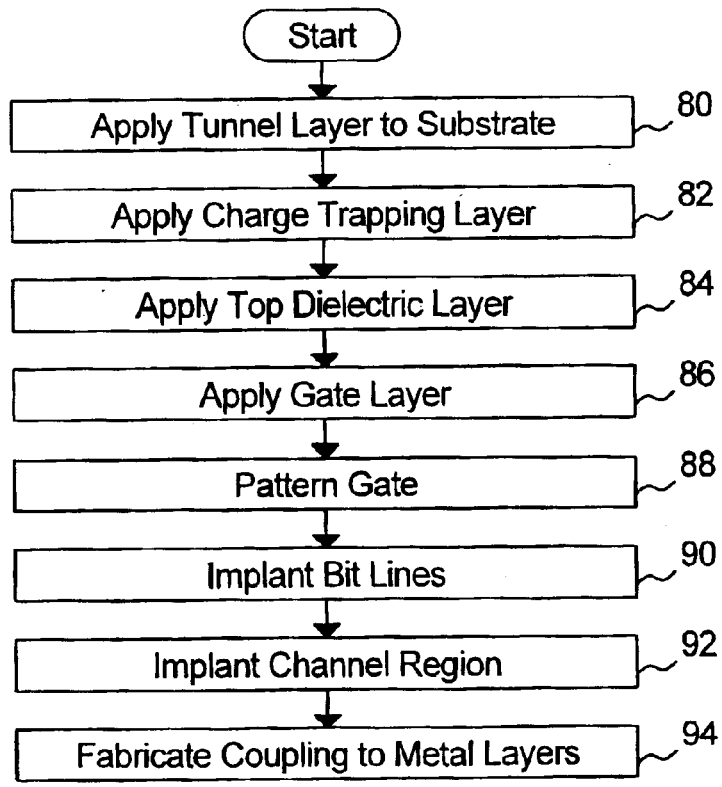
FIG. 5 is a flow chart representing exemplary processing steps for fabricating the memory cell array of FIG. 1.

Turning to the cross section diagrams of FIGS. 3a–3e in conjunction with the flow chart of FIG. 5, exemplary processing steps for fabricating the memory cell array 40 of FIG. 1 are represented. The exemplary fabrication process provides for fabricating the array on the surface of a silicon on insulator substrate 95 that includes polysilicon device layer 51 separated from a base substrate 55 by a thin insulating layer 53 as shown in FIG. 3a.

Step 80 represents growing the tunnel layer 54 on the surface of the polysilicon device layer 51. As discussed, the tunnel layer 54 may comprise silicon dioxide and such silicon dioxide may be thermally grown to a thickness as previously described.

Step 82 represents depositing the charge trapping layer 56 on the surface of the tunnel layer 54. As discussed, the tunnel layer 54 may comprise a nitride compound and may be deposited using a low pressure chemical vapor deposition (LPCVD) process.

Step 84 represents depositing the top dielectric layer 58 on the surface of the charge trapping layer 56. The top dielectric layer 58 may be deposited using a LPCVD process.

Figure 3B:
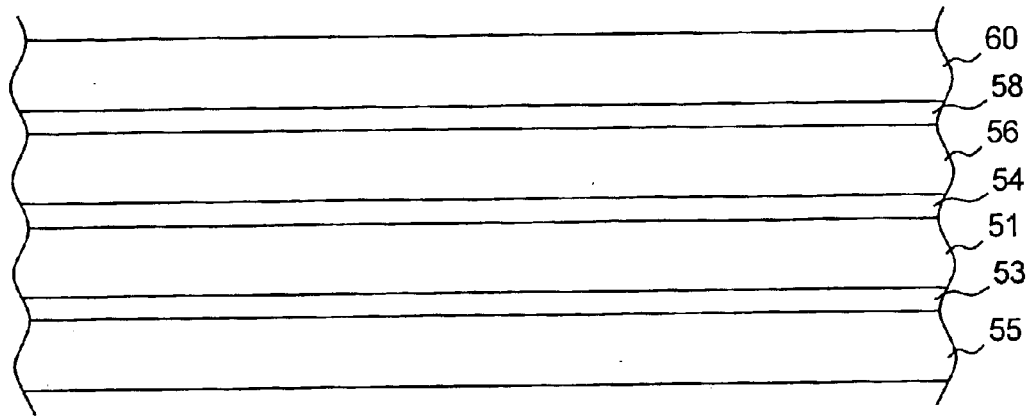

Step 86 represents depositing the polysilicon gate layer 60 on the surface of the top dielectric layer 58 using a LPCVD process. The cross section diagram of FIG. 3b represents the substrate 55 after depositing each of the tunnel layer 54, the charge tapping layer 56, the top dielectric layer 58, and the polysilicon gate layer 60 as performed in steps 80, 82, 84, and 86 respectively.

Figure 3C:
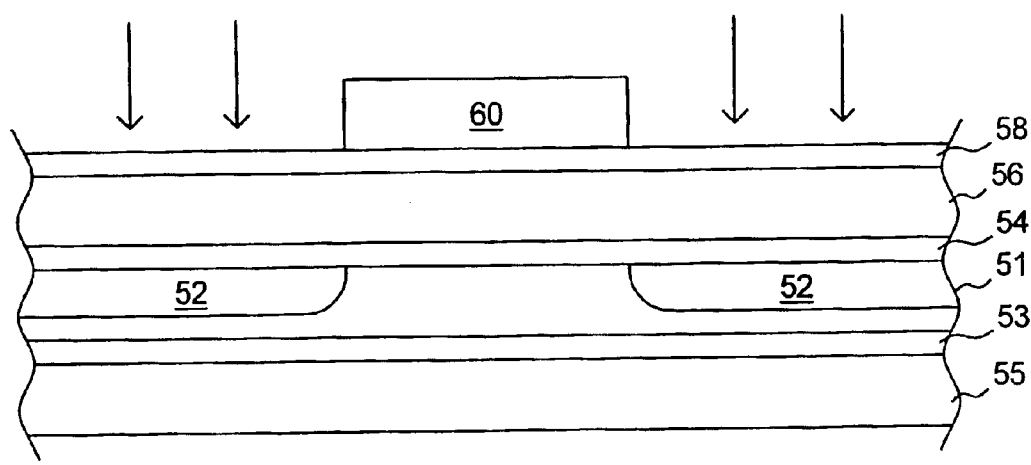

Step 88 represents patterning the gate 60 of each memory cell in the array 40. More specifically, a nitride mask layer and a photoresist layer may be applied to the top of the gate layer 60. The photoresist is exposed to patterned illumination and developed to form a photoresist mask over the nitride mask layer that masks the gate 60 while exposing the bit lines. The nitride is then etched to form a hard mask masking the gate 60 while exposing the bit lines. The gate layer 60 is then etched such that gate 60 remains while the top dielectric layer 58 is exposed over the bit lines as shown in FIG. 3c.

Step 90 represents implanting the bit lines 52. In the exemplary embodiment, the bit lines 49 are implanted with an electron donor impurity such as arsenic. The implant dosage may be $1 \times 10^{15}$ molecules per cubic centimeter. The gate 60 functions as a mask of the channel region 50 such that the implant impurity only penetrates the polysilicon layer 51 in the bit line 52 regions.

Figure 3D:
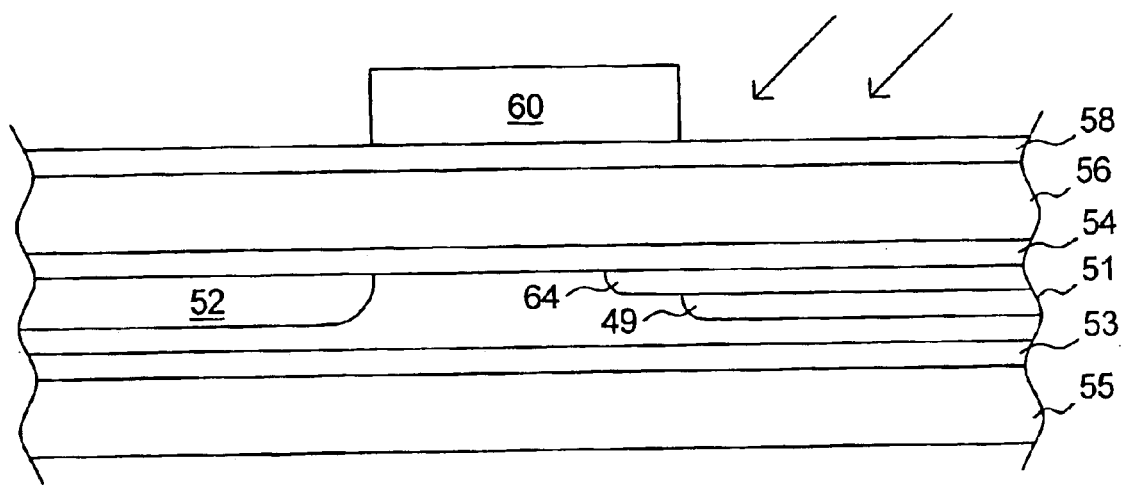

Step 92 represents implanting the slightly more heavily doped channel region 64. The channel region 51 comprises the polysilicon layer 51 moderately doped with a hole donor impurity such as boron as represented by FIG. 3d. The slightly more heavily doped channel region 64 comprises a higher doping concentration of the same hole donor impurity and is achieved by performing a sideways implant with the gate 60 functioning as a mask and the implant impurity penetrating the channel region 51 beneath only one side of the mask 60. The implant dosage may be $1 \times 10^{12}$ molecules per cubic centimeter.

Figure 3E:
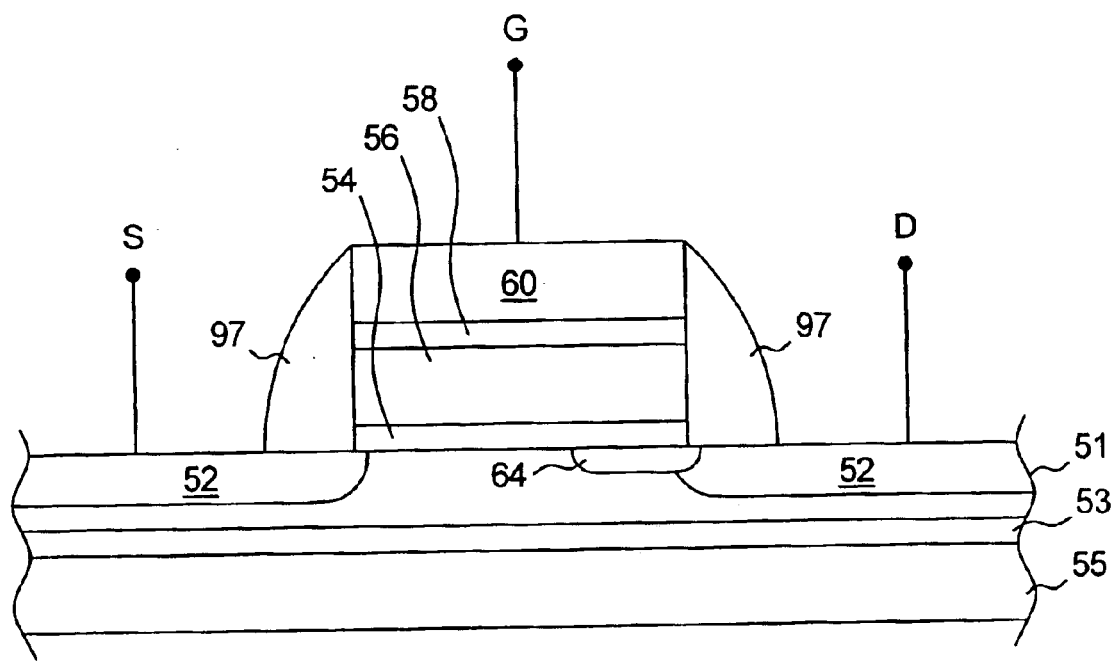

Step 94 represents forming nitride spacers 97 on the side of the dielectric layers 54, 56, 58, and the gate 60 as is shown in FIG. 3e. More specifically, a layer of nitride is applied over the surface of the wafer and anisotropically etched to form the spacers. Thereafter step 96 represents forming contacts to the bit lines 52 and the gate 60 such that the bit lines 52 and the gate 60 may be coupled to metal layers fabricated above the memory cell structure.

Although this invention has been shown and described with respect to certain preferred embodiments, it is obvious that equivalents and modifications will occur to others skilled in the art upon the reading and understanding of the specification. For example, Although the cells of the array are shown as a substantially planar structure formed on the silicon substrate, it should be appreciated that the teachings of this invention may be applied to both planar, fin formed, and other dielectric memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention includes all such equivalents and modifications, and is limited only by the scope of the following claims.

What is claimed is:

1. An array of non-volatile memory cells for storing a data pattern and reproducing the data pattern, the array comprising:
    a substrate comprising a semiconductor moderately doped with a first type of impurity to enhance conductivity;
    a plurality of parallel and spaced apart bit line diffusions within the substrate defining a plurality of vertical channel regions spaced there between, each bit line diffusion comprising the substrate doped with a second type of impurity to enhance conductivity and each channel comprising:
        a moderately doped channel region portion adjacent to a first one of the bit line diffusions and comprising the substrate moderately doped with the first type of impurity; and
        a slightly more heavily doped channel region portion adjacent to a second one of the bit line diffusions and comprising the substrate more heavily doped with the first type of impurity than the moderately doped channel region, the slightly more heavily doped channel region extending laterally from the second one of the bit line diffusions substantially under a tunnel layer of a corresponding memory cell among the array of memory cells;
    a plurality of parallel spaced apart semiconductor word lines positioned over the substrate and separated from the substrate by an insulator film, a charge storage region, and a second insulator film, the word lines being perpendicular to the bit line diffusions and forming a memory cell at each intersection of a word line and a channel region; and
    an array control circuit coupled to each bit line diffusion and each word line for:
        providing a drain bit line programming potential the second one of the bit line diffusions to accelerating electrons from the first one of the bit line diffusions towards the second one of the bit line diffusions; and
        providing a word line programming potential to a selected one of the word lines to divert the accelerated electrons from the channel region beneath the selected word line across the insulator film into the charge storage region.

2. The array of claim 1, wherein:
    the drain bit line programming potential is a positive potential with respect to a potential applied to the first one of the bit line diffusions;
    the word line programming potential is a positive potential with respect to the potential applied to the first one of the bit line diffusions; and
    the word line programming potential is greater than the drain bit line programming potential.

3. The array of claim 2, wherein the drain bit programming potential is between 4 volts and 6 volts.

4. The array of claim 1, wherein the thickness of the charge storage region is between 20 angstroms and 100 angstroms.

5. The array of claim 4, wherein the thickness of the charge storage region is between 25 angstroms and 75 angstroms.

6. The array of claim 5, wherein the thickness of the charge storage region is between 30 angstroms and 50 angstroms.

7. The array of claim 1, wherein the length of the moderately doped channel region comprises approximately 90 percent of the channel length and the length of the slightly more heavily doped channel region comprises approximately 10 percent of the channel length.

8. The array of claim 1, wherein the length of the moderately doped channel region comprises approximately 95 percent of the channel length and the length of the slightly more heavily doped channel region comprises approximately 5 percent of the channel length.

9. The array of claim 1, wherein the length of the moderately doped channel region comprises approximately 98 percent of the channel length and the length of the slightly more heavily doped channel region comprises approximately 2 percent of the channel length.

10. The array of claim 1 wherein depth of the lightly doped channel region extends from the surface to the insulating oxide layer, the depth of the heavily doped channel region extends from the surface to a depth of approximately 100 angstroms.

11. An array of non-volatile memory cells for storing a data pattern and reproducing the data pattern, the array comprising:
    a substrate comprising a semiconductor moderately doped with a first type of impurity to enhance conductivity;
    a source bit line diffusion within the substrate and comprising the substrate doped with a second type of impurity;
    a drain bit line diffusion within the substrate and comprising the substrate doped with the second type of impurity, the drain bit line diffusion being parallel to the source bit line diffusion and spaced apart from the source bit line diffusion by:

a moderately doped channel region adjacent to the source bit line diffusion, the lightly doped channel region comprising the substrate lightly doped with the first type of impurity; and a slightly more heavily doped channel region adjacent to the drain bit line diffusion, the heavily doped channel region comprising the substrate more heavily doped with the first type of impurity than the moderately doped channel region, the slightly more heavily doped channel region extending laterally from the drain bit line substantially under a tunnel layer of a corresponding memory cell among the array of memory cells;

a semiconductor word line positioned over the substrate and separated from the substrate by an insulator film, a charge storage region and a second insulator film, the word lines being perpendicular to the bit line diffusions and forming a memory cell at its intersection with each of the lightly doped channel region and the heavily doped channel region; and an array control circuit coupled to each bit line diffusion and each word line for:

providing a drain bit line programming potential the drain bit line diffusion to accelerating electrons from the source bit line diffusion towards the drain bit line diffusion; and providing a word line programming potential to the word line to divert the accelerated electrons from the heavily doped channel region beneath through the insulator film into the charge storage region.

12. The array of claim 1, wherein:

the drain bit line programming potential is a positive potential with respect to a potential applied to the first one of the bit line diffusions;

the word line programming potential is a positive potential with respect to the potential applied to the first one of the bit line diffusions; and the word line programming potential is greater than the drain bit line programming potential.

13. The array of claim 12, wherein the drain bit programming potential is between 4 volts and 6 volts.

14. The array of claim 11, wherein the thickness of the charge storage region is between 20 angstroms and 100 angstroms.

15. The array of claim 14, wherein the thickness of the charge storage region is between 25 angstroms and 75 angstroms.

16. The array of claim 15, wherein the thickness of the charge storage region is between 30 angstroms and 50 angstroms.

17. The array of claim 11, wherein the length of the moderately doped channel region comprises approximately 90 percent of the channel length and the length of the slightly more heavily doped channel region comprises approximately 10 percent of the channel length.

18. The array of claim 11, wherein the length of the moderately doped channel region comprises approximately 95 percent of the channel length and the length of the slightly more heavily doped channel region comprises approximately 5 percent of the channel length.

19. The array of claim 11, wherein the length of the moderately doped channel region comprises approximately 98 percent of the channel length and the length of the slightly more heavily doped channel region comprises approximately 2 percent of the channel length.

20. The array of claim 11, wherein depth of the lightly doped channel region extends from the surface to the insulating oxide layer, the depth of the heavily doped channel region extends from the surface to a depth of approximately 100 angstroms.

* * * * *

UNITED STATES PATENT AND TRADEMARK OFFICE
CERTIFICATE OF CORRECTION

PATENT NO.   : 6,768,160 B1
DATED        : July 27, 2004
INVENTOR(S)  : Li et al.

It is certified that error appears in the above-identified patent and that said Letters Patent is hereby corrected as shown below:

Column 4,
Line 39, replace "48a b" with -- 48b --.

Column 5,
Line 9, replace "51 if of" with -- 51 of --.

Signed and Sealed this

Sixteenth Day of November, 2004

JON W. DUDAS
*Director of the United States Patent and Trademark Office*